(12) United States Patent
Nagayama et al.

(10) Patent No.: US 6,373,187 B1
(45) Date of Patent: *Apr. 16, 2002

(54) DISPLAY PANEL USING ORGANIC ELECTROLUMINESCENT MATERIAL AND METHOD FOR THE MANUFACTURE THEREOF

(75) Inventors: Kenichi Nagayama, Yamagata-ken; Teruichi Watanabe, Saitama-ken, both of (JP)

(73) Assignees: Pioneer Electronic Corporation, Tokyo; Tohoku Pioneer Electronic Corporation, Yamagata-ken, both of (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/080,400

(22) Filed: May 18, 1998

(30) Foreign Application Priority Data

May 20, 1997 (JP) .............................. 9-145816

(51) Int. Cl.⁷ .............................. H01J 1/62; H01J 63/04
(52) U.S. Cl. ...................... 313/506; 313/504; 313/509; 427/66
(58) Field of Search ................................ 313/498, 506, 313/505, 509, 504; 445/24; 428/917; 315/169.3, 495, 496, 497; 427/66

(56) References Cited

U.S. PATENT DOCUMENTS

| | | | | |
|---|---|---|---|---|
| 5,701,055 A | * | 12/1997 | Nagayama et al. | 313/504 |
| 5,742,129 A | * | 4/1998 | Nagayama et al. | 313/169.3 |
| 5,773,931 A | * | 6/1998 | Shi et al. | 313/509 |
| 5,804,917 A | * | 9/1998 | Takahashi et al. | 313/504 |
| 5,952,037 A | * | 9/1999 | Nagayama et al. | 427/66 |
| 5,962,970 A | * | 10/1999 | Yokoi et al. | 313/506 |
| 6,005,344 A | * | 12/1999 | Fleming | 313/504 |
| 6,037,712 A | * | 3/2000 | Codama et al. | 313/504 |

* cited by examiner

*Primary Examiner*—Ashok Patel
*Assistant Examiner*—Mariceli Santiago
(74) *Attorney, Agent, or Firm*—Arent Fox Kintner Plotkin & Kahn, PLLC

(57) ABSTRACT

A display panel using an organic electroluminescent material, includes: a substrate; a plurality of first type electrodes formed on the surface of one side of the substrate; a plurality of electrically insulating partition wall groups each including a plurality of partition walls, partially covering and partially exposing the first type electrodes; a plurality of organic electroluminescent layers formed on exposed portions of the first type electrodes; and a plurality of second type electrodes formed on the organic electroluminescent layers. In particular, each partition wall group has one or more internal spaces each formed between two adjacent partition walls.

11 Claims, 10 Drawing Sheets

PRIOR ART

PRIOR ART

PRIOR ART

DISPLAY PANEL USING ORGANIC ELECTROLUMINESCENT MATERIAL AND METHOD FOR THE MANUFACTURE THEREOF

BACKGROUND OF THE INVENTION

The present invention relates to a display panel and a method for the manufacture thereof, in particular to a display panel using organic electroluminescent material and a method for manufacturing the same.

Figure 7:
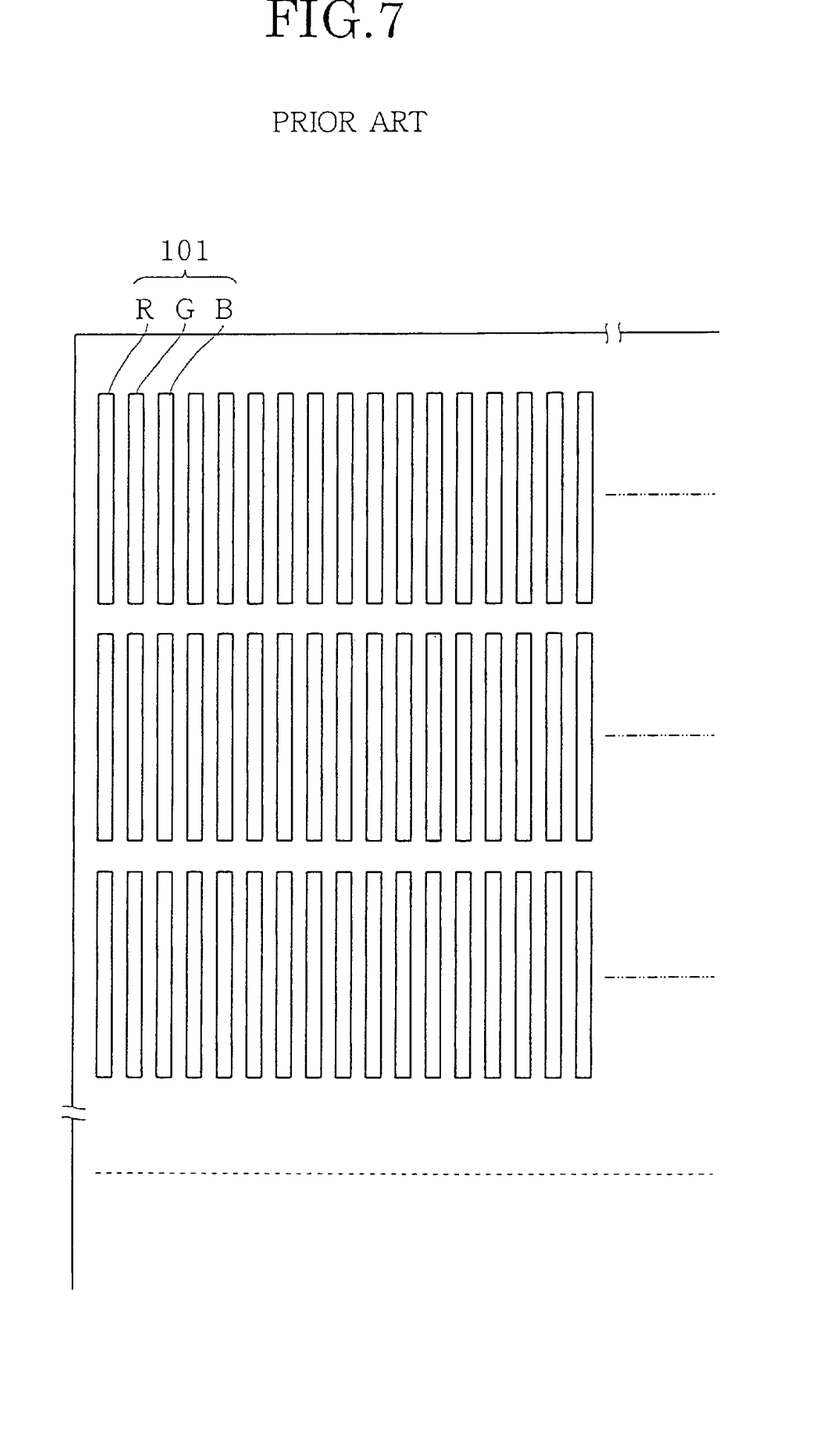
FIG. 7 is a plane view illustrating an arrangement of picture elements on a display panel according to a prior art.

FIG. 7 illustrates an arrangement of luminescent picture elements in a conventional full-color display panel using organic electroluminescent material. As shown in FIG. 7, the conventional display panel has a plurality of luminescent picture elements 101 arranged in matrix manner. Each picture element 101 includes a red luminescent unit R, a green luminescent unit G and a blue luminescent unit B, all extending in a predetermined direction so as to form a stripe pattern on the display.

Figure 8:
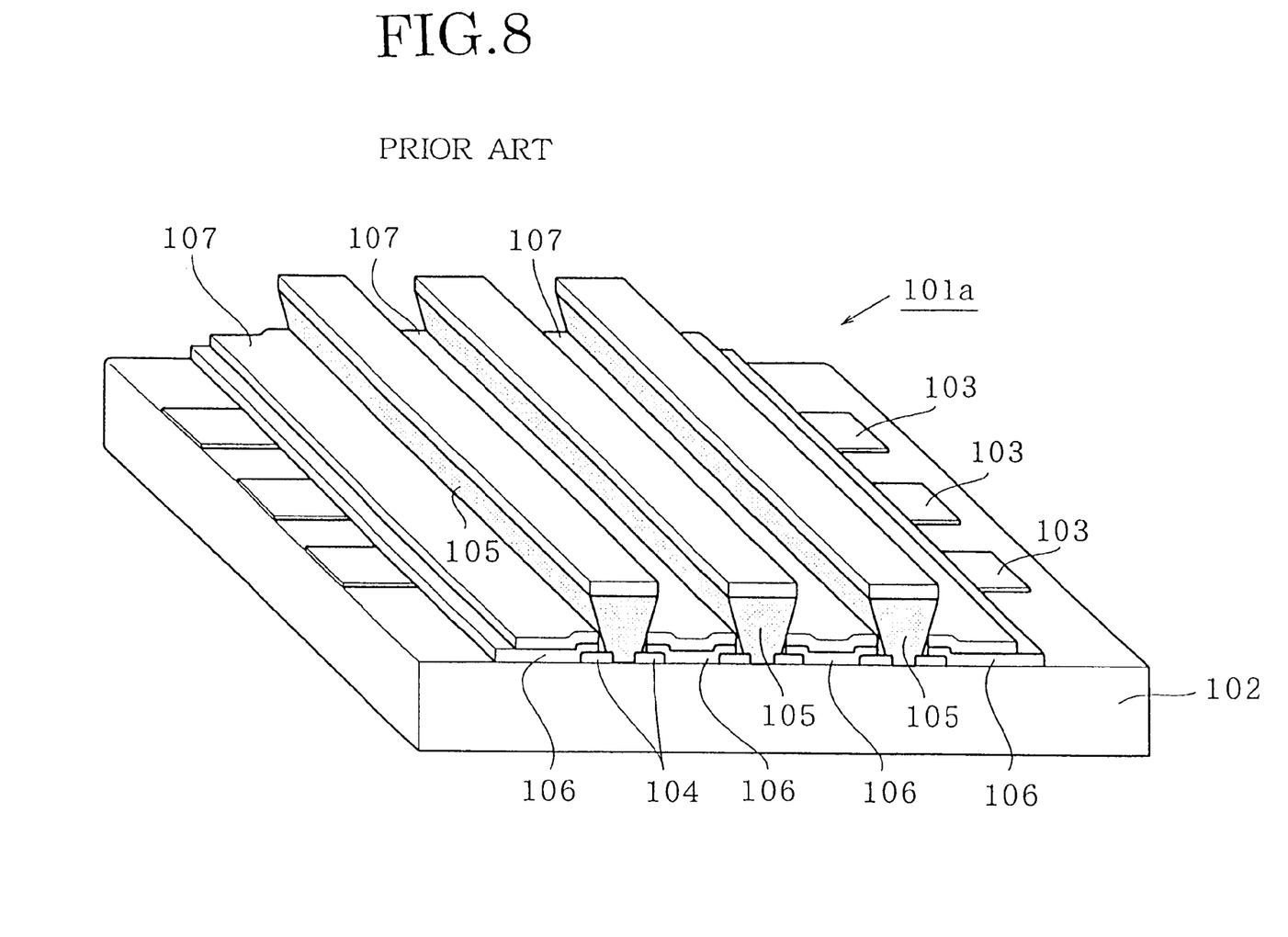
FIG. 8 is a perspective view illustrating a base section of a display panel according to a prior art.

FIG. 8 illustrates the structure of a base section 101a mounting the luminescent picture elements 101. As shown in FIG. 8, the base section 101a has a plurality of first type electrodes 103 consisting of ITO, which are formed on the surface of one side of a transparent glass substrate 102. Further, a plurality of electrically insulating layers 104 and a plurality of electrically insulating partition walls 105 are provided at a predetermined interval over the first type electrodes 103 on the glass substrate 102, in a manner such that both the layers 104 and the walls 105 are orthogonal to and partially cover the electrodes 103.

Referring again to FIG. 8, a plurality of thin layers 106 of an organic electroluminescent material are formed in parallel with the layers 104 and partition walls 105 on exposed portions of the electrodes 103, a plurality of second type electrodes 107 are formed over the thin layers 106 so that both the electrodes 107 and the thin layers 106 are arranged in the same direction as the partition walls 105.

As shown in FIG. 8, the plurality of second type electrodes 107 are separated from one another by the partition walls 105 so as to prevent a possible electric short between two adjacent electrodes 107. Further, in order to exactly separate two adjacent electrodes 107, it is preferred that each partition wall 105 be formed to have an inverted trapezoidal cross section.

Figure 9:
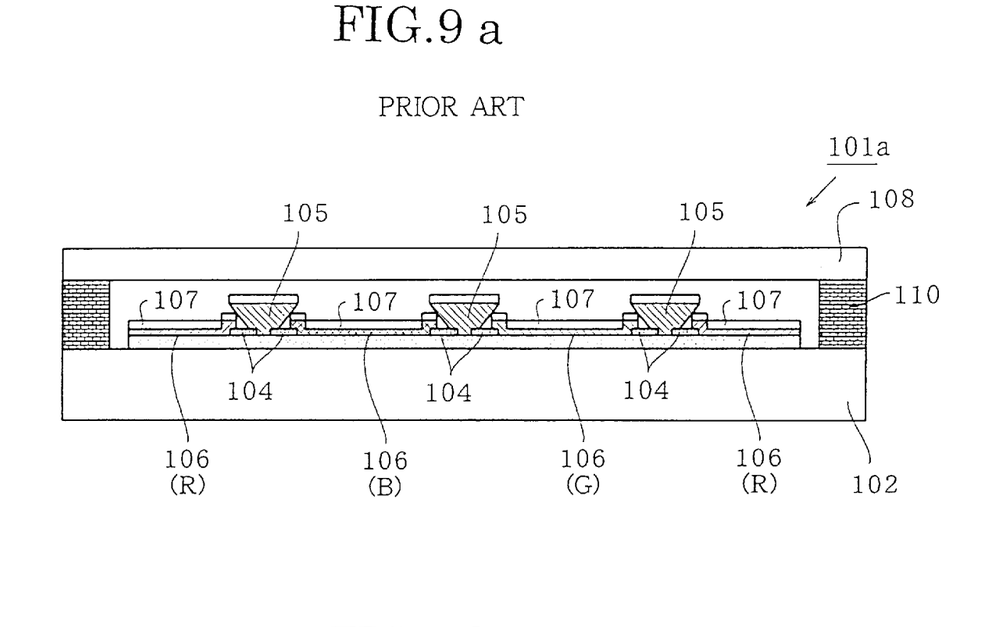
FIGS. 9a and 9b are cross sectional views illustrating a glass cover or a protection layer is used to seal up a base section of a display panel according to a prior art.

However, since both the electroluminescent layers 106 and the partition walls 105 are all apt to be affected by a moisture, it is necessary to provide a glass cover or a protection layer on the transparent glass substrate 102 to cover up the organic electroluminescent layers 106 and the partition walls 105, as shown in FIG. 9. FIG. 9a is a cross sectional view illustrating a display panel base section 101a including a plurality of picture elements which are sealed up by a glass cover 108. FIG. 9b is a cross sectional view illustrating a display panel base section 101a including a plurality of picture elements ire sealed up by a protection layer 109 having a moisture proof property.

In use, the first type electroeds 103 and the second type electrodes 107 are energized, so that some portions of the organic electroluminescent layers 106 corresponding to intersections of the first type electrodes 103 with the second type electrodes 107, are caused to emit lights which are displayed through the transparent glass substrate 102.

A process for manufacturing a display panel base section 101a may be described in the following with reference to FIGS. 10a–10c.

Figure 10:
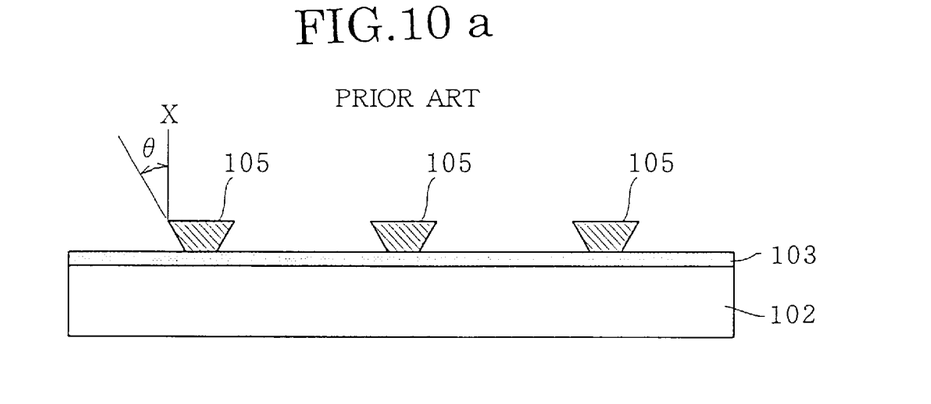
FIGS. 10a–10c are cross sectional views illustrating various steps involved in a process for producing a display panel according to a prior art.

At first, as shown in FIG. 10a, a plurality of first type electrodes 103 consisting of an electrically conductive transparent material such as ITO are formed on the transparent glass substrate 102. Then, a plurality of partition walls 105 are formed on the glass substrate 102. Each partition wall 105 has a cross section formed into an inverted trapezoidal shape having an overhang angle θ with a vertical axis X.

Subsequently, as shown in FIG. 10b, with the use of a mask 111 punched in accordance with a predetermined pattern, the organic electroluminescent layers 106 corresponding to red luminescent unit R and green luminescent unit G and blue luminescent unit B, are formed on exposed portions of the first type electrodes 103.

Finally, as shown in FIG. 10c, a metal of low electric resistance such as Al, Cu or Au is vapor depositted on the organic electroluminescent layers 106 so as to form thereon a plurality of second type electrodes 107.

When the above metal is vapor depositted, the deposition direction is usually controlled to be perpendicular with respect to the substrate 102, so that the metal may be prevented from being depositted onto the side surfaces of the partition walls 105. In this way, the metal depositted on the top of each partition wall 105 is separated from adjacent second type electrodes 107, thereby preventing any possible electric short between two adjacent electrodes 107.

However, with the above method for producing a display panel, there is a possibility that some of the partition walls 105 will be partially broken, and another possibility that some fine contaminants or particles will attach to the side surfaces or the surrounding areas of the partition walls 105. As a result, when a metal is vapor depositted to form the second type electrodes 107, two adjacent electrodes 107 will be undesirably connected through the above fine contaminates or particles.

Figure 11:
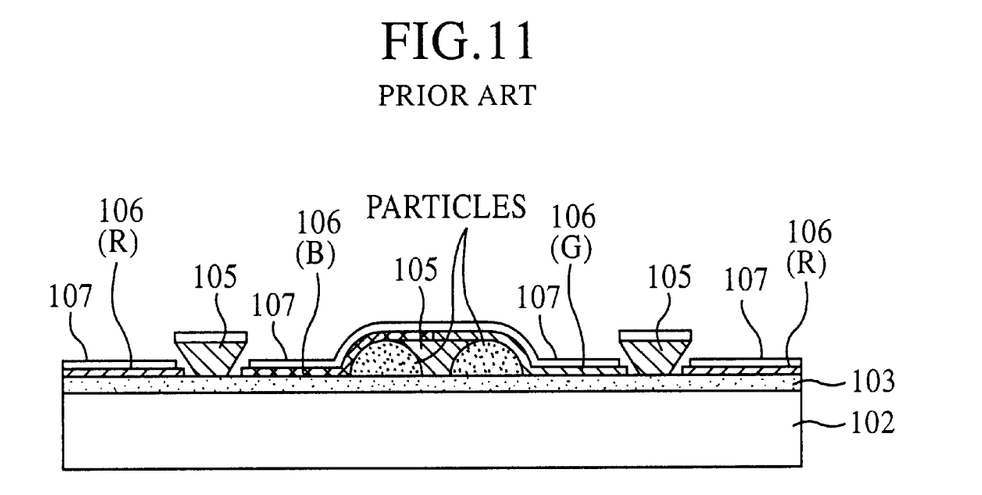
FIG. 11 is a cross sectional view illustrating a condition where two adjacent electrodes on both sides of a partition wall are undesirably connected to each other through a mass of fine particles attached on the side surfaces of a partition wall.

FIG. 11 is a cross sectional view indicating a condition where two adjacent electrodes 107 together with two organic electroluminescent layers 106 on both sides of a partition wall 105 are undesirably connected to each other through a mass of fine particles attached on the side surfaces of the partition wall 105. Accordingly, it is impossible to prevent electric short between two adjacent electrodes 107.

SUMMARY OF THE INVENTION

It is an object of the present invention to provide an improved display panel capable of exactly isolating two second type electrodes even if they are disposed very close to each other, so as to solve the above-mentioned problems peculiar to the above-mentioned prior art.

According to the present invention, there is provided an improved display panel using an organic electroluminescent material, comprising: a substrate; a plurality of first type electrodes formed on the surface of one side of the substrate; a plurality of electrically insulating partition wall groups each including a plurality of partition walls, partially covering and partially exposing the first type electrodes; a plurality of organic electroluminescent layers formed on exposed portions of the first type electrodes; and a plurality of second type electrodes formed on the organic electroluminescent layers. In particular, each partition wall group has one or more internal spaces each formed between two adjacent partition walls.

In more detail, there is provided an improved display panel which employs an organic electroluminescent material and in which a plurality of luminescent units are arranged in a matrix manner, said display panel comprising: a substrate; a plurality of first type electrodes arranged in parallel with one another at a predetermined interval on the surface of one side of the substrate; a plurality of electrically insulating partition wall groups each including a plurality of partition walls, partially covering and partially exposing the first type electrodes, arranged at a predetermined interval in a direction orthogonal to the first type electrodes on the substrate; a plurality of organic electroluminescent layers formed on exposed portions of the first type electrodes, arranged in parallel with said partition walls; and a plurality of second type electrodes formed on the organic electroluminescent layers in parallel therewith, each disposed between two adjacent partition wall groups. In particular, each partition wall group includes a plurality of partition walls arranged in parallel with one another at a predetermined interval, producing one or more internal spaces each formed between two adjacent partition walls.

In one aspect of the present invention, an elongated internal space is formed between every two adjacent partition walls, in a manner such that a cross section area over the elongate opening thereof is smaller than that at deep side.

In another aspect of the present invention, each partition wall has a cross section of overhung shape including a projecting upper portion projecting in a direction parallel with the substrate.

In a further aspect of the present invention, the projecting upper portion of each partition wall is higher than the height of the second type electrodes.

In a still further aspect of the present invention, prior to the formation of the partition walls, a plurality of electrically insulating layers are formed on the first type electrodes in the areas where the partition walls are to be formed, so that the electrically insulating layers are under partition walls and in surrounding areas.

In one more aspect of the present invention, the second type electrodes are formed by depositing a metal material on one side of the substrate after the formation of the first type electrodes and the partition walls and the organic electroluminescent layers, each internal space is so formed that the metal material is allowed to be smoothly depositted thereinto.

In one more aspect of the present invention, the substrate and the first type electrodes are all transparent.

Further, the present invention provides a method of producing a display panel using an organic electroluminescent material, comprising the steps of: forming a plurality of first type electrodes on the surface of one side of a substrate; forming a plurality of electrically insulating partition wall groups each including a plurality of partition walls, partially covering and partially exposing the first type electrodes, producing a plurality of internal spaces each formed between two adjacent partition walls; forming a plurality of organic electroluminescent layers on exposed portions of the first type electrodes; and forming a plurality of second type electrodes on the organic electroluminescent layers.

In one more aspect of the present invention, a mask means having a plurality of slit-like openings is placed over the tops of the partition walls, in a manner such that the slit-like openings are aligned with exposed portions of the first type electrodes between two partition wall groups, an electroluminescent material is depositted through the slit-like openings onto the first type electrodes, followed by moving the mask means onto the tops of other partition walls and depositting the electroluminescent material in the same manner so as to form a plurality of electroluminescent layers.

The above objects and features of the present invention will become better understood from the following description with reference to the accompanying drawings.

DESCRIPTION OF THE PREFERRED EMBODIMENTS

Figure 1A:
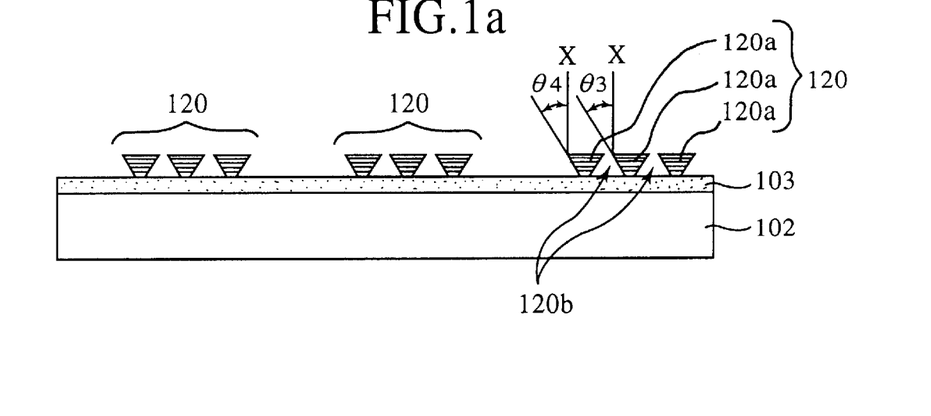
FIGS. 1a–1c are cross sectional views illustrating various steps involved in a process for producing a display panel, according to a first embodiment of the present invention.
Figure 1B:
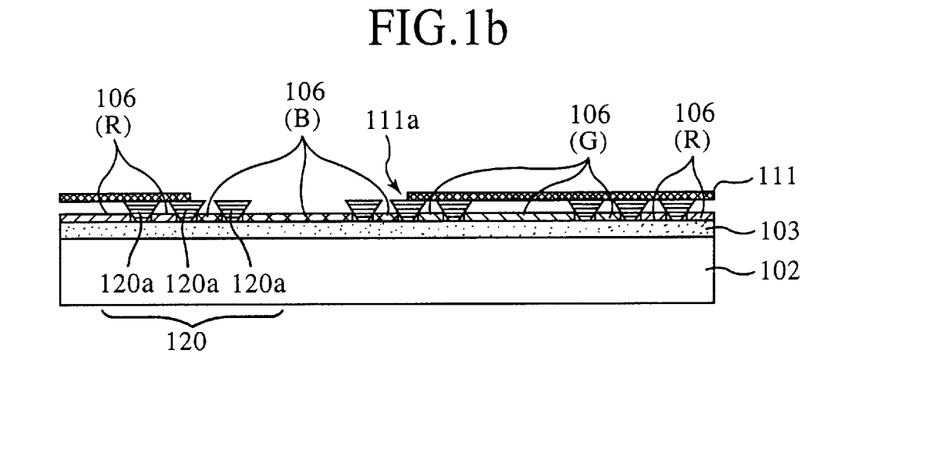
Figure 1C:
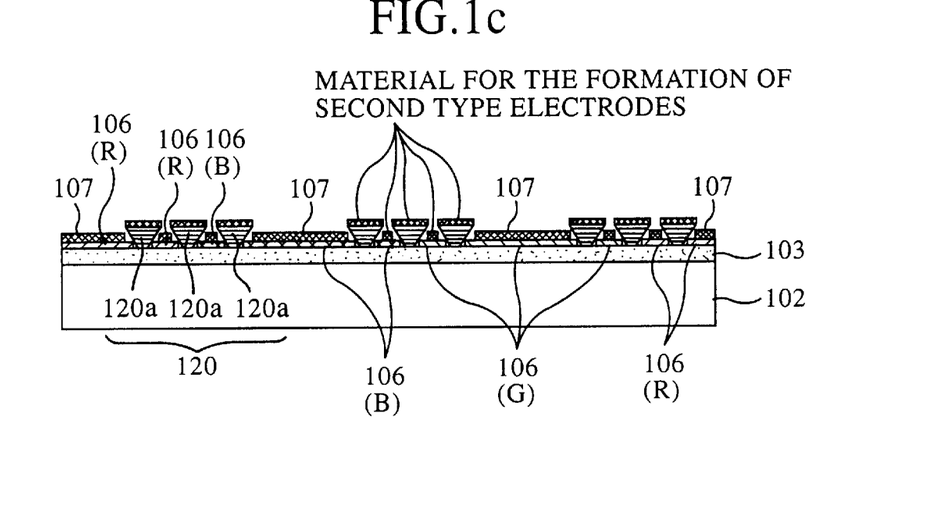

FIGS. 1a–1c shows a process for producing an improved display panel of the present invention, according to a first embodiment thereof.

At first, as shown in FIG. 1a, a plurality of first type electrodes 103 consisting of an electrically conductive transparent layer such as ITO are formed on the surface of one side of a transparent glass substrate 102. Then, a plurality of elongated partition wall groups 120 are provided orthogonal to the first type electrodes 103 on the glass substrate 102.

Referring again to FIG. 1a, each partition wall group 120 includes a plurality of (for example, three) partition walls 120a made of an organic material having a sufficient electrically insulating property. The partition walls 120a in each partition wall group 120 are arranged in parallel with one another at a predetermined interval, so that they are in an electrically separated condition.

Further, each partition wall 120a is formed to have a thickness higher than second type electrodes 107 which is to be formed later.

In addition, as shown in FIG. 1a, each partition wall 120a has a cross section formed into an inverted trapezoidal shape having an inclination angle θ3 or θ4 with respect to a vertical axis X. In an example shown in FIG. 1a, the inclination angle of a middle partition wall 120a is θ3, while the inclination angle of a side partition wall 120a is θ4. However, the inclination angles θ3 and θ4 may also be made equal to each other.

In this way, an elongated internal space 120b is formed between every two adjacent partition walls 120a, in a manner such that a cross section area along the elongate opening thereof is smaller than that at deep side. On the other hand, each elongated space 120b has its elongated opening so formed that a metal material may be smoothly vapor depositted thereinto.

Then, referring to FIG. 1b, a plurality of organic electroluminescent layers 106 are formed on exposed portions of the first type electrodes 103 between every two partition walls 120a, 120a, so as to produce at least one luminescent layer on each first type electrode 103. As shown in FIG. 1b, the organic electroluminescent layers 106 include red luminescent units (R), blue luminescent units (B), green luminescent units (G), which are arranged repeatedly from left to right.

A process for the formation of organic electroluminescent layers 106 may be explained as follows.

At first, a mask means 111 having a plurality of slit-like openings 111a is placed over the tops of the partition walls 120, in a manner such that the slit-like openings 111a are aligned with exposed portions of the first type electrodes 103 between two partition walls 120a, 120a. Then, a vapor deposition is conducted to form a first electroluminescent layer 106 (for example, red luminescent unit R) having a predetermined thickness.

Afterwards, the mask means 111 is moved a distance equal to the width of one partition wall group 120, so that another vapor deposition is conducted to form a second electroluminescent layer 106 (for example, blue luminescent unit B) having a predetermined thickness.

Subsequently, the mask means 111 is further moved a distance equal to the width of one partition wall group 120, so that a further vapor deposition is conducted to form a third electroluminescent layer 106 (for example, green luminescent unit G) having a predetermined thickness.

The above steps are repeated several times by moving the mask means 111 rightwardly again and again, thereby forming a plurality of electroluminescent layers 106 on exposed portions of the first type electrodes 103.

In this way, a plurality of electroluminescent layers 106 including red luminescent units (R) and blue luminescent units (B) and green luminescent units (G), are formed so as to cover the entire exposed portions of the first type electrodes 103 between every two adjacent partition walls 120a, 120a.

Referring again to FIG. 1b, since both sides of each slit-like opening 111a are mounted on two middle partition walls 120a of two wall groups 120, exposed portions of the first type electrodes 103 in an internal space 120b within a slit-like opening 111a, will be surely covered by the organic electroluminescent layers 106 (for example, blue luminescent units B).

Accordingly, all exposed portions of the first type electrodes 103 exposed in all the internal spaces 120b will be covered by the organic electroluminescent layers 106 (red, green or blue luminescent units).

Then, at a step shown in FIG. 1c, a metal of low electric resistance such as Al, Cu or Au is vapor depositted on the organic electroluminescent layers 106 so as to form thereon a plurality of second type electrodes 107.

When one of the above metal is vapor depositted to form the second type electrodes 107, it is important that a deposition angle for emitting a metal material from a deposition source (not shown) should be smaller than either an inclination angle $\theta 3$ of a middle partition wall 120a or an inclination angle $\theta 4$ of a side partition wall 120a. This is because if a deposition angle for emitting a metal material is larger than the inclination angle $\theta 3$ or $\theta 4$, there is a possibility that a metal material for the formation of the second type electrodes 107 will be attached to the side surfaces of a partition wall 120a, causing two adjacent second type electrodes 107 to be undesirably connected with each other through a partition wall 120a.

In this embodiment of the present invention, since all exposed portions of the first type electrodes 103 exposed in all the spaces 120b are covered by the organic electroluminescent layers 106, a metal material (for the formation of the second type electrodes 107) depositted in internal spaces 120b will not cause an electric short with the first type electrodes 103.

Figure 2:
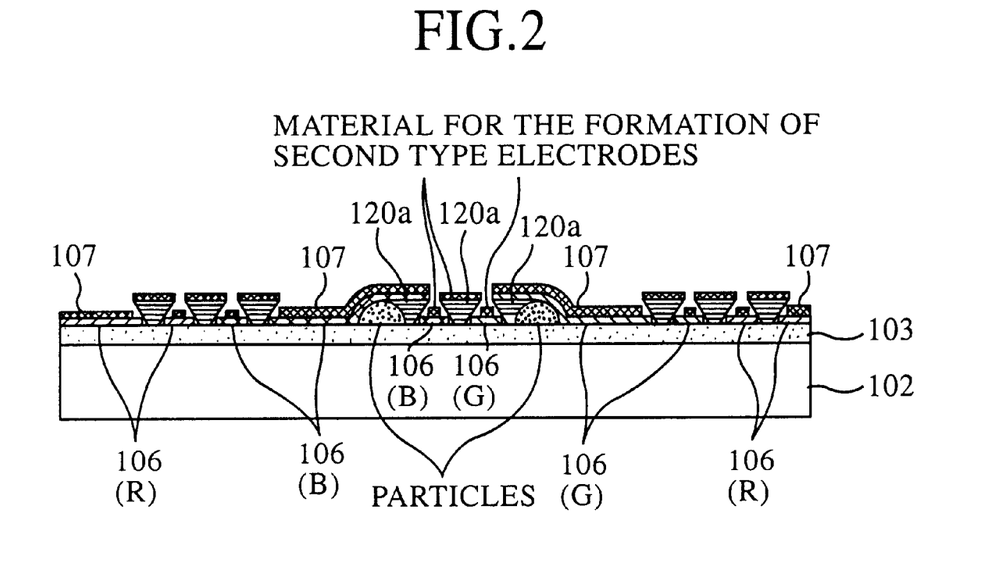
FIG. 2 is a cross sectional view illustrating an improved display panel in which particles are attached on the side surfaces of partition walls.

FIG. 2 is a cross sectional view indicating that a mass of particles are undesirably attached on the side surfaces of two partition walls 120a, 120a. As shown in FIG. 2, since a metal material (for the formation of the second type electrode 107) is non-continuously depositted in the internal spaces 120b, it is sure that adjacent two partition walls 120a, 120a will not be undesirably connected together, so that adjacent two second type electrodes 107, 107 are exactly separated from each other.

Figure 3:
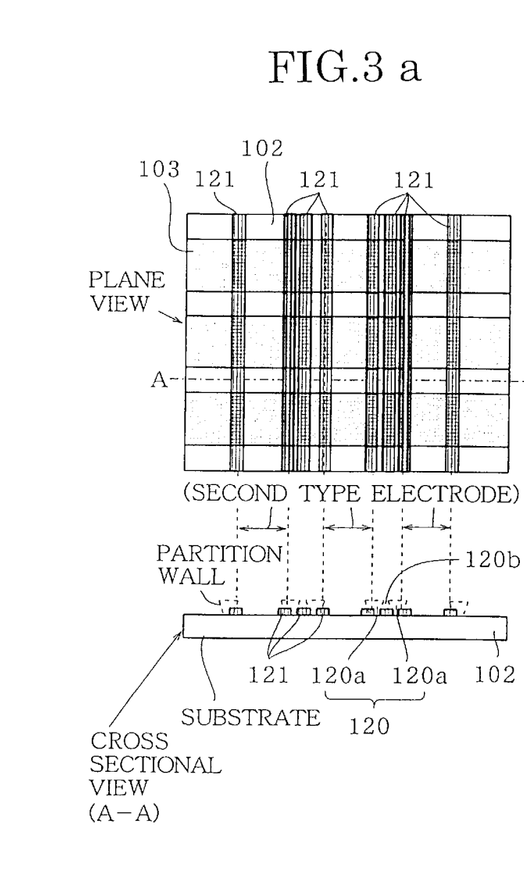
FIGS. 3a–3c are plane views and cross sectional views illustrating how electrically insulating layers are provided in a display panel.
Figure 3B:
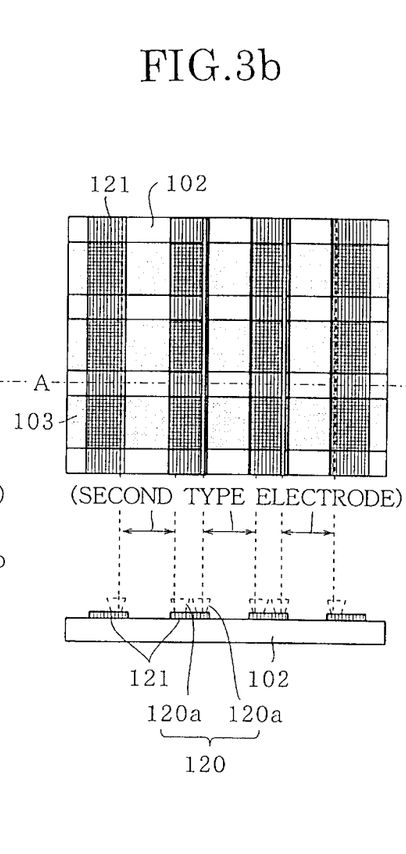
Figure 3C:
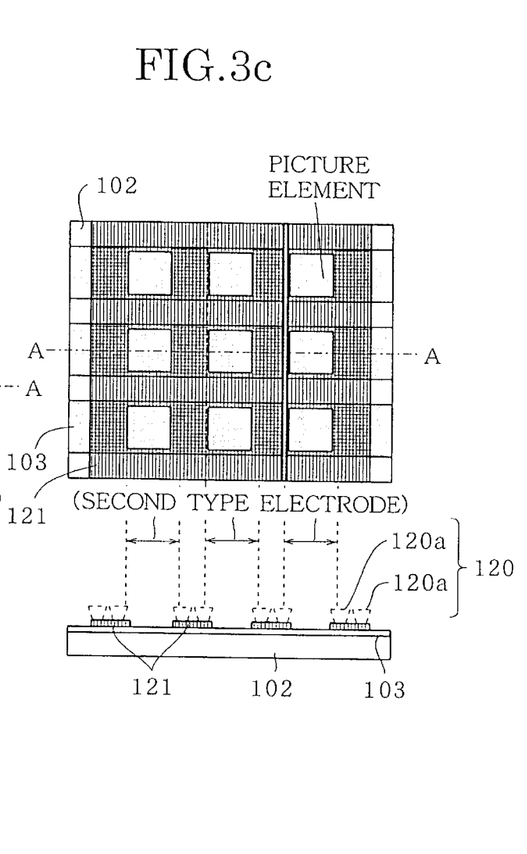

FIGS. 3a–3c illustrate display panels made according to a second embodiment of the present invention, which are the same as that of the first embodiment except that a plurality of electrically insulating layers 121 are formed prior to the formation of partition walls 120a.

FIG. 3a includes a plane view and a cross sectional view indicating an improved display panel according to the second embodiment. As shown in FIG. 3a, the display panel comprises a transparent glass substrate 102, a plurality of first type electrodes 103 formed on the substrate 102, a plurality of electrically insulating layers 121 formed on the first type electrodes 103 in an orthogonal direction with respect to the electrodes 103, a plurality of partition walls 120a formed on the electrically insulating layers 121. In detail, the electrically insulating layers 121 are formed in the areas in which partition walls 120a are to be formed and in surrounding areas, also formed in areas between two adjacent partition walls 120a.

FIG. 3b includes a plane view and a cross sectional view indicating another improved display panel according to the second embodiment, which is almost the same as that shown in FIG. 3a, except that the electrically insulating layers 121 are formed completely under each partition wall group 120 and in surrounding areas, thus also formed in positions between every two adjacent partition walls 120a and in surrounding areas.

FIG. 3c includes a plane view and a cross sectional view indicating another improved display panel according to the second embodiment, which is almost the same as that shown in FIG. 3b, except that the electrically insulating layers 121 are formed all over the substrate 102 except on picture element portions arranged in a matrix manner.

FIGS. 4a–4d shows a process for producing an improved display panel of the present invention, according to the second embodiment.

Figure 4:
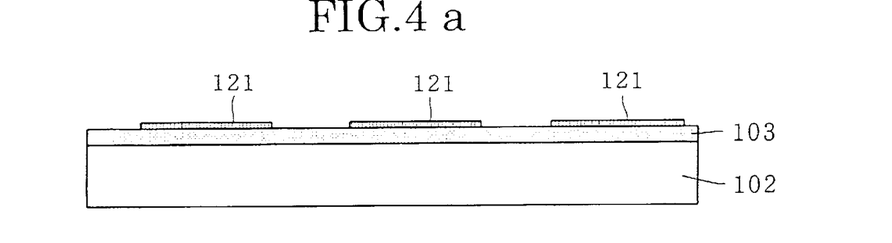
FIGS. 4a–4d are cross sectional views illustrating various steps involved in a process for producing a display panel, according to a second embodiment of the present invention.

At first, as shown in FIG. 4a, a plurality of first type electrodes 103 are formed in a predetermined pattern on a transparent glass substrate 102, then a plurality of electrically insulating layers 121 (made of a resin) are tightly formed on the first type electrodes 103 in the portions where a plurality of partition walls 120a are to be formed.

Afterwards, as shown in FIG. 4b, a plurality of partition walls 120a are formed on the electrically insulating layers 121 in the same manner as that described in the first embodiment.

Subsequently, as shown in FIG. 4c, in the same manner as described in the first embodiment, a plurality of electroluminescent layers 106 including red luminescent units (R) and blue luminescent units (B) and green luminescent units (G), are formed to cover the entire exposed portions of the first type electrodes 103 between every two adjacent partition walls 120a, 120a.

Finally, as shown in FIG. 4d, a metal of low electric resistance such as Al, Cu or Au is vapor depositted vertically on the organic electroluminescent layers 106 so as to form thereon a plurality of second type electrodes 107.

In this way, since the electrically insulating layers 121 are formed between the first type electrodes 103 and the second type electrodes 107, a possible electric short between the two electrodes 103 and 107 may be prevented even if the deposition material (for the formation of the second type electrodes 107) is depositted beyond predetermined areas in the vicinity of the partition walls 120a.

Figure 5:
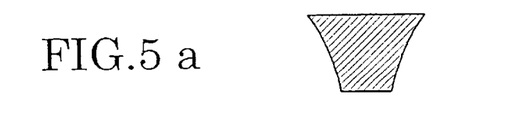
FIGS. 5a–5e are cross sectional views illustrating various partition walls having different cross sections.

Although in the above embodiments it has been described that each partition wall group 120 includes three partition walls 120a, and that each partition wall 120a has a cross section formed into an inverted trapezoidal shape, it is also possible that each partition wall group 120 may include four or more partition walls 120a, and that each partition wall 120a may be formed into any one of the shapes shown in FIG. 5 so long as an overhung cross section is obtained.

FIGS. 5a–5d are cross sectional views of partition walls having different cross sections, each being integrally formed of a single identical material. FIG. 5e is a cross sectional view indicating a partition wall consisting of two parts made of different materials.

The partition walls shown in FIGS. 5d and 5e each has a cross section of overhung shape projecting in a direction parallel with the substrate 102.

Figure 6:
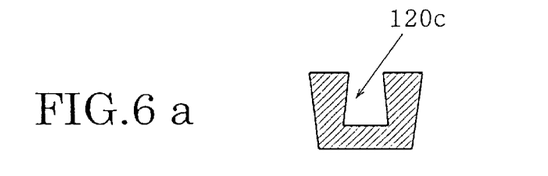
FIGS. 6a–6b are cross sectional views illustrating two partition walls each formed with at least one recess portion.

Further, it is also possible that a plurality of partition walls 120a are mutually connected through a bottom portion so as to form a partition wall group, as shown in FIGS. 6a and 6b.

Referring to FIGS. 6a and 6b, if each partition wall 120a has its cross section formed into an overhung shape, a recess portion 120c formed between two partition walls 120a can serve to enhance an effect of preventing a possible electric short between two adjacent second type electrodes 107.

While the presently preferred embodiments of the this invention have been shown and described above, it is to be understood that these disclosures are for the purpose of illustration and that various changes and modifications may be made without departing from the scope of the invention as set forth in the appended claims.

What is claimed is:

1. A display panel using an organic electroluminescent material, said display panel comprising:

a substrate;

a plurality of first type electrodes formed on the surface of one side of the substrate;

a plurality of electrically insulating partition wall groups each including a plurality of partition walls, partially covering and partially exposing the first type electrodes, each interval between adjacent partition wall groups being larger than each interval between adjacent partition walls;

a plurality of organic electroluminescent layers formed on the first type electrodes; and a plurality of second type electrodes formed on the organic electroluminescent layers;

wherein each partition wall group has one or more internal spaces each formed between two adjacent partition walls;

wherein prior to the formation of the partition walls, a plurality of electrically insulating layers are formed on the first type electrodes in the areas where the partition walls are to be formed, so that the electrically insulating layers are under partition walls and in surrounding areas;

wherein the electrically insulating layers completely separate the partition walls from the first type electrodes.

2. A display panel which employs an organic electroluminescent material and in which a plurality of luminescent units are arranged in a matrix manner, said display panel comprising:

a substrate;

a plurality of first type electrodes arranged in parallel with one another at a predetermined interval on the surface of one side of the substrate;

a plurality of electrically insulating partition wall groups each including a plurality of partition walls, partially covering and partially exposing the first type electrodes, arranged at a predetermined interval in a direction orthogonal to the first type electrodes on the substrate, each interval between adjacent partition wall groups being larger than each interval between adjacent partition walls;

a plurality of organic electroluminescent layers formed on exposed portions of the first type electrodes, arranged in parallel with said partition walls; and a plurality of second type electrodes formed on the organic electroluminescent layers in parallel therewith, each disposed between two adjacent partition wall groups;

wherein each partition wall group has one or more internal spaces each formed between adjacent partition walls;

wherein prior to the formation of the partition walls, a plurality of electrically insulating layers are formed on the first type electrodes in the areas where the partition walls are to be formed, so that the electrically insulating layers are under partition walls and in surrounding areas;

wherein the electrically insulating layers completely separate the partition walls from the first type electrodes.

3. A display panel which employs an organic electroluminescent material and in which a plurality of luminescent units are arranged in a matrix manner, said display panel comprising:

a substrate;

a plurality of first type electrodes arranged in parallel with one another at a predetermined interval on the surface of one side of the substrate;

a plurality of electrically insulating partition wall groups each including a plurality of partition walls, partially covering and partially exposing the first type electrodes, arranged at a predetermined interval in a direction orthogonal to the first type electrodes on the substrate, each interval between adjacent partition wall groups being larger than each interval between adjacent partition walls;

a plurality of organic electroluminescent layers formed on exposed portions of the first type electrodes, arranged in parallel with said partition walls; and a plurality of second type electrodes formed on the organic electroluminescent layers in parallel therewith, each disposed between two adjacent partition wall groups;

wherein each partition wall group includes a plurality of partition walls arranged in parallel with one another at a predetermined interval, producing one or more internal spaces each formed between two adjacent partition walls;

wherein prior to the formation of the partition walls, a plurality of electrically insulating layers are formed on the first type electrodes in the areas where the partition walls are to be formed, so that the electrically insulating layers are under partition walls and in surrounding areas;

wherein the electrically insulating layers completely separate the partition walls from the first type electrodes.

4. A display panel according to any one of claims 1–3, wherein an elongated internal space is formed between every two adjacent partition walls, in a manner such that a cross section area over the elongate opening thereof is smaller than that at deep side.

5. A display panel according to any one of claims 1–3, wherein each partition wall has a cross section of overhung shape including a projecting upper portion projecting in a direction parallel with the substrate.

6. A display panel according to claim 5, wherein the projecting upper portion of each partition wall is higher than the height of the second type electrodes.

7. A display panel according to any one of claims 1–3, wherein the second type electrodes are formed by depositing a metal material on one side of the substrate after the formation of the first type electrodes and the partition walls and the organic electroluminescent layers, each internal space is so formed that the metal material is allowed to be smoothly deposited thereinto.

8. A display panel according to any one of claims 1–3, wherein the substrate and the first type electrodes are all transparent.

9. A method of producing a display panel using an organic electroluminescent material, comprising the steps of:

forming a plurality of first type electrodes on the surface of one side of a substrate;

forming a plurality of electrically insulating partition wall groups each including a plurality of partition walls, partially covering and partially exposing the first type electrodes, each interval between adjacent partition wall groups being larger than each interval between adjacent partition walls, producing one or more internal spaces each formed between two adjacent partition walls;

forming a plurality of organic electroluminescent layers on exposed portions of the first type electrodes; and forming a plurality of second type electrodes on the organic electroluminescent layers;

wherein prior to the formation of the partition walls, a plurality of electrically insulating layers are formed on the first type electrodes in the areas where the partition walls are to be formed, so that the electrically insulating layers are under partition walls and in surrounding areas;

wherein the electrically insulating layers completely separate the partition walls from the first type electrodes.

10. A method of producing a display panel which employs an organic electroluminescent material and in which a plurality of luminescent units are arranged in a matrix manner, said method comprising the steps of:

forming a plurality of first type electrodes on the surface of one side of a substrate;

forming a plurality of electrically insulating partition wall groups each including a plurality of partition walls, partially covering and partially exposing the first type electrodes, with each interval between adjacent partition wall groups being larger than each interval between adjacent partition walls, producing a plurality of internal spaces each formed between two adjacent partition walls;

forming a plurality of organic electroluminescent layers on exposed portions of the first type electrodes; and forming a plurality of second type electrodes on the organic electroluminescent layers;

wherein prior to the formation of the partition walls, a plurality of electrically insulating layers are formed on the first type electrodes in the areas where the partition walls are to be formed, so that the electrically insulating layers are under partition walls and in surrounding areas;

wherein the electrically insulating layers completely separate the partition walls from the first type electrodes.

11. A method according to claim 10, wherein a mask means having a plurality of slit-like openings is placed over the tops of the partition walls, in a manner such that the slit-like openings are aligned with exposed portions of the first type electrodes between two partition wall groups, an electroluminescent material is deposited through the slit-like openings onto the first type electrodes, followed by moving the mask means onto the tops of other partition walls and depositing the electroluminescent material in the same manner so as to form a plurality of electroluminescent layers.

* * * * *